United States Patent
Liu et al.

(10) Patent No.: US 10,375,658 B2
(45) Date of Patent: Aug. 6, 2019

(54) AUTOMATIC GAIN CONTROL METHOD AND COMMUNICATIONS DEVICE IN WIRELESS LOCAL AREA NETWORK

(71) Applicant: Huawei Technologies Co., Ltd., Shenzhen (CN)

(72) Inventors: Yalin Liu, Shanghai (CN); Sheng Liu, Shenzhen (CN); Min Yan, Shenzhen (CN); Xin Xue, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 140 days.

(21) Appl. No.: 15/594,192

(22) Filed: May 12, 2017

(65) Prior Publication Data

US 2017/0251439 A1   Aug. 31, 2017

Related U.S. Application Data

(63) Continuation of application No. PCT/CN2014/091068, filed on Nov. 14, 2014.

(51) Int. Cl.
*H04W 4/00* (2018.01)
*H04W 52/52* (2009.01)
(Continued)

(52) U.S. Cl.
CPC .......... *H04W 52/52* (2013.01); *H03G 3/3078* (2013.01); *H04B 17/318* (2015.01);
(Continued)

(58) Field of Classification Search
CPC .... H04W 52/52; H04W 84/12; H04B 17/318; H04L 27/2613; H04L 27/2607;
(Continued)

(56) References Cited

U.S. PATENT DOCUMENTS

| 7,813,436 B1 | 10/2010 | Zhao et al. |
| 2009/0028106 A1 | 1/2009 | Hansen et al. |

(Continued)

FOREIGN PATENT DOCUMENTS

| CN | 102273164 A | 12/2011 |
| CN | 103188787 A | 7/2013 |
| WO | 2011130473 A1 | 10/2011 |

OTHER PUBLICATIONS

IEEE Standard for Information technology—Telecommunications and information exchange between systems—Local and metropolitan area networks—Specific requirements, Part 11: Wireless LAN Medium Access Control (MAC) and Physical Layer (PHY) Specifications, Amendment 4: Enhancements for Very Higher Throughput for Operation in Bands below 6 GHz, IEEE Std 802.11ac-2013, IEEE Computer Society, Sponsored by LAN/MAN Standards Committee, Dec. 11, 2013, 425 pages.

(Continued)

*Primary Examiner* — Chuong T Ho
(74) *Attorney, Agent, or Firm* — Slater Matsil, LLP

(57) ABSTRACT

Embodiments disclose an automatic gain control method and a communications device in a wireless local area network. The method includes generating a physical layer packet, where the physical layer packet includes a high efficiency long training field, the high efficiency long training field includes N symbols, a length of a cyclic prefix (CP_ of a first symbol in the N symbols is greater than or equal to a minimum length required by a receiver device to perform automatic gain control (AGC) estimation, and N is a positive integer. The method also includes sending the physical layer packet to the receiver device.

20 Claims, 4 Drawing Sheets

(51) Int. Cl.
*H04L 27/26* (2006.01)
*H04L 29/06* (2006.01)
*H03G 3/30* (2006.01)
*H04B 17/318* (2015.01)
*H04L 29/08* (2006.01)
*H04W 84/12* (2009.01)

(52) U.S. Cl.
CPC ...... *H04L 27/2607* (2013.01); *H04L 27/2613* (2013.01); *H04L 27/2678* (2013.01); *H04L 69/22* (2013.01); *H04L 69/323* (2013.01); *H04W 84/12* (2013.01)

(58) Field of Classification Search
CPC ... H04L 27/2678; H04L 69/22; H04L 69/323; H03G 3/3078
USPC .......................................... 370/329, 330, 338
See application file for complete search history.

(56) References Cited

U.S. PATENT DOCUMENTS

| | | |
|---|---|---|
| 2010/0189188 A1 | 7/2010 | Li et al. |
| 2014/0169326 A1 | 6/2014 | Levanen et al. |
| 2014/0307650 A1 | 10/2014 | Vermani et al. |
| 2015/0146647 A1* | 5/2015 | Chatterjee ............ H04L 5/0032 370/329 |
| 2016/0112157 A1* | 4/2016 | Li ....................... G06F 11/1004 714/807 |
| 2016/0112851 A1* | 4/2016 | Li ........................... H04L 69/18 370/338 |
| 2016/0353414 A1* | 12/2016 | Choi ....................... H04W 4/70 |
| 2017/0273106 A1* | 9/2017 | Chatterjee ............. H04L 5/0032 |

OTHER PUBLICATIONS

IEEE Standard for Information technology—Telecommunications and information exchange between systems—Local and metropolitan area networks—Specific requirements, Part 11: Wireless LAN Medium Access Control (MAC) and Physical Layer (PHY) Specifications, Amendment 5: Enhancements for Higher Throughput, IEEE Std 802.11n-2009, IEEE Computer Society, Sponsored by LAN/MAN Standards Committee, Oct. 29, 2009, 536 pages.

* cited by examiner

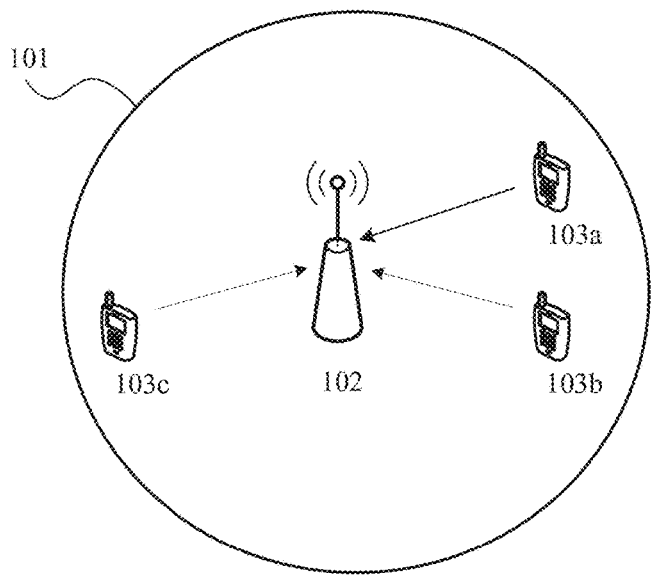

FIG. 1

Generate a physical layer packet, where the physical layer packet includes a high efficiency long training field, the high efficiency long training field includes N symbols, a length of a cyclic prefix CP of a first symbol in the N symbols is greater than or equal to a minimum length required by a receiver device to perform automatic gain control AGC estimation, and N is a positive integer ⸺ 201

Send the physical layer packet to the receiver device ⸺ 202

FIG. 2

FIG. 3

AUTOMATIC GAIN CONTROL METHOD AND COMMUNICATIONS DEVICE IN WIRELESS LOCAL AREA NETWORK

CROSS-REFERENCE TO RELATED APPLICATIONS

This application is a continuation of International Application No. PCT/CN2014/091068, filed on Nov. 14, 2014, the disclosure of which is hereby incorporated by reference in its entirety.

TECHNICAL FIELD

Embodiments of the present invention relate to the communications field, and more specifically, to an automatic gain control method and a communications device in a wireless local area network.

BACKGROUND

In a wireless communications system, due to impact of factors such as a transmission distance and a Doppler frequency shift, strength of a signal received by a receiver varies in a large dynamic range. A strong signal tends to saturate the receiver. A weak signal cannot be detected by a demodulator and therefore, tends to be lost. Currently, signals having a wide disparity in strength may be adjusted into a proper range by using an automatic gain control (AGC for short) method, so that a signal to noise ratio (SNR for short) of a signal that is output to a baseband is optimal.

For example, when a receiver in a wireless local area network (WLAN for short) receives a signal, a power gain is first adjusted for the received signal, so that the signal enters into an analog to digital converter at a proper power. Then an analog signal is converted into a digital signal, so that digital processing is further performed on the received signal. In an Institute for Electrical and Electronics Engineers (IEEE) 802.11n standard, AGC estimation is performed on the received signal by using a legacy short training field (L-STF for short) and a high throughput short training field (HT-STF for short) in a preamble. In an IEEE 802.11ac standard, AGC estimation is performed on the received signal by using an L-STF and a very high throughput short training field (VHT-STF for short) in a preamble.

However, when AGC estimation is performed on a received signal by using an L-STF and an HT-STF, or an L-STF and a VHT-STF according to the foregoing method, system overheads are relatively large. The system overheads may be further reduced when a good AGC effect is ensured.

SUMMARY

Embodiments of the present invention provide an automatic gain control method and a communications device in a wireless local area network, so that system overheads can be reduced.

According to a first aspect, an embodiment of the present invention provides an automatic gain control method, including generating a physical layer packet, where the physical layer packet includes a high efficiency long training field, the high efficiency long training field includes N symbols, a length of a cyclic prefix (CP) of a first symbol in the N symbols is greater than or equal to a minimum length required by a receiver device to perform automatic gain control (AGC) estimation, and N is a positive integer. The method also includes sending the physical layer packet to the receiver device.

According to a second aspect, an embodiment of the present invention provides an automatic gain control method in a wireless local area network. The method includes receiving a physical layer packet from a sender device, where the physical layer packet includes a high efficiency long training field, the high efficiency long training field includes N symbols, a length of a CP of a first symbol in the N symbols is greater than or equal to a minimum length required by a receiver device to perform AGC estimation, and N is a positive integer. The method also includes performing AGC estimation on a basis of the CP of the first symbol in the N symbols of the high efficiency long training field.

With reference to the second aspect and the foregoing implementation manner of the second aspect, in a tenth implementation manner of the second aspect, the physical layer packet includes a legacy short training field, and before the performing AGC estimation on a basis of the CP of the first symbol in the N symbols of the high efficiency long training field, the method further includes: performing AGC estimation on a basis of the legacy short training field.

According to a third aspect, an embodiment of the present invention provides a communications device, including: a generation unit, configured to generate a physical layer packet, where the physical layer packet includes a high efficiency long training field, the high efficiency long training field includes N symbols, a length of a CP of a first symbol in the N symbols is greater than or equal to a minimum length required by a receiver device to perform AGC estimation, and N is a positive integer; and a sending unit, configured to send the physical layer packet to the receiver device.

According to a fourth aspect, an embodiment of the present invention provides a communications device, including: a receiving unit, configured to receive a physical layer packet from a sender device, where the physical layer packet includes a high efficiency long training field, the high efficiency long training field includes N symbols, a length of a CP of a first symbol in the N symbols is greater than or equal to a minimum length required by a receiver device to perform AGC estimation, and N is a positive integer; and a processing unit, configured to perform AGC estimation on a basis of the CP of the first symbol in the N symbols of the high efficiency long training field.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

FIG. 1 is a schematic architectural diagram of an applicable communications system according to an embodiment of the present invention;

FIG. 2 is a schematic flowchart of an automatic gain control method in a wireless local area network according to an embodiment of the present invention;

FIG. 3 is a schematic diagram of a physical layer packet according to an embodiment of the present invention;

DETAILED DESCRIPTION OF ILLUSTRATIVE EMBODIMENTS

Figure 4:
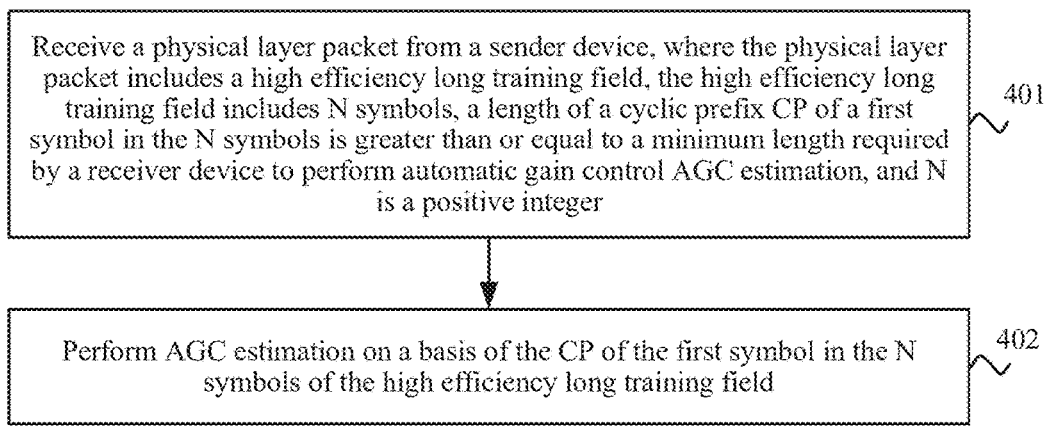
FIG. 4 is a schematic flowchart of an automatic gain control method in a wireless local area network according to another embodiment of the present invention.

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present embodiments.

It should be understood that the technical solutions in the embodiments of the present invention may be applied to a wireless local access network (WLAN) system. In the embodiments of the present invention, an access point (AP) can convert a wired network into a wireless network, and provide a wireless access service for a station (STA). The STA may be user equipment ("UE" for short), a terminal, a mobile station ("MS" for short), a mobile terminal (Terminal), or the like. For example, the STA may be a mobile phone (or referred to as a "cellular" phone), a computer with a mobile terminal, or the like. For another example, the STA may be a portable, pocket-sized, handheld, computer built-in, or vehicle-mounted mobile apparatus.

For ease of description, an AP and a STA are used as an example for description in the following embodiment.

FIG. 1 is a schematic architectural diagram of an applicable communications system according to an embodiment of the present invention. The communications system in FIG. 1 is a WLAN system, and an AP 102 with a coverage area 101 is used as an example for description herein. It should be understood that a quantity of APs in the WLAN system is not limited in this embodiment of the present invention.

STAs (103a, 103b, 103c) fall within the coverage area 101 of the AP 102, and access the AP 102 for communication. It is assumed that during communication between the STA 103a and the AP 102, the AP 102 is a sender device, and sends a physical layer packet (also referred to as a physical layer data packet) to the STA 103a. When receiving the physical layer packet, a receiver of the STA 103a needs to adjust a power gain for a received signal, so that the signal enters into an analog to digital converter at a proper power. Then an analog signal is converted into a digital signal, so that digital processing is further performed on the received signal. During communication between STAs or communication between APs, an automatic gain control principle is similar, and to avoid repetition, details are not described herein again.

If automatic gain control (AGC) estimation is performed on a received signal by using an legacy short training field (L-STF) and a high throughput short training field (HT-STF), or an L-STF and a very high throughput short training field (VHT-STF), and then a gain of a receiver is adjusted, system overheads are relatively large.

Embodiments of the present invention provide an automatic gain control method and a communications device, so that system overheads can be reduced. It should be understood that the foregoing communications system is merely an example, and is not intended to limit the protection scope of the embodiments of the present invention. The embodiments of the present invention may be applied to a next generation Wi-Fi system such as an HEW system of an IEEE 802.11ax standard, may also be applied to another wireless local area network system, and may further be applied to a cellular network. The embodiments of the present invention may further be applied to intensive user scenarios such as an office area, a stadium, and a railway station.

FIG. 2 is a schematic flowchart of an automatic gain control method in a wireless local area network according to an embodiment of the present invention. The method in FIG. 2 may be executed by a sender device, such as the AP 102 or the STAs (103a, 103b, 103c) shown in FIG. 1. More specifically, this method may be executed by a transmitter of the sender device.

201. Generate a physical layer packet, where the physical layer packet includes a high efficiency long training field, the high efficiency long training field includes N symbols, a length of a cyclic prefix (CP) of a first symbol in the N symbols is greater than or equal to a minimum length required by a receiver device to perform automatic gain control (AGC) estimation, and N is a positive integer.

FIG. 3 is a schematic diagram of a physical layer packet according to an embodiment of the present invention. As shown in FIG. 3, the physical layer packet (also referred to as a physical layer data packet) includes two parts: a preamble and data. The preamble includes a legacy preamble and a high efficiency preamble. The legacy preamble includes a legacy short training field L-STF, a legacy long training field L-LTF, and a legacy signal field L-SIG. The high efficiency preamble includes a high efficiency signal field HE-SIG-1 (also referred to as an HEW-SIG-1 or an HEW-SIG-A) and a high efficiency long training field HE-LTF (also referred to as an HEW-LTF).

The HE-LTF includes N symbols: an HE-LTF1, an HE-LTF2 . . . , and an HE-LTFN. A cyclic prefix (CP for short) of the first symbol HE-LTF1 in the N symbols is used by the receiver device to perform AGC estimation.

It should be understood that the physical packet shown in FIG. 3 is merely an example of the present embodiments, and is not intended to limit the protection scope of this embodiment of the present invention. For example, the physical layer packet may further include another part such as a high efficiency short training field HE-STF (also referred to as an HEW-STF). For another example, the physical layer packet may not include one or more fields in the foregoing legacy preamble, or the foregoing multiple fields may use different names. It should also be understood that the N symbols included in the high efficiency long training field may also be described as N sequences included in the high efficiency long training field.

It should also be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that the sender device generates the physical layer packet according to this minimum length.

202. Send the physical layer packet to the receiver device.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

Optionally, in an embodiment, the length of the CP of the first symbol in the N symbols of the high efficiency long training field is greater than a length of a CP of another symbol in the N symbols.

For example, the length of the CP of the first symbol in the high efficiency long training field is extended, so that the length of the CP of the first symbol in the high efficiency long training field is greater than the length of the CP of the another symbol. When receiving the physical layer packet, the receiver device performs AGC estimation according to the length of the CP of the first symbol, and then performs AGC. In addition, intersymbol interference of the HE-LTF1 may further be reduced according to this embodiment of the present invention.

Optionally, in another embodiment, the length of the CP of the first symbol in the N symbols of the high efficiency long training field is 1.6 microseconds, 2.4 microseconds, 3.2 microseconds, or 4.0 microseconds.

Optionally, in another embodiment, when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in another embodiment, the length of the CP of the first symbol in the N symbols of the high efficiency long training field is 4.0 microseconds, and the length of the CP of the another symbol in the N symbols of the high efficiency long training field is 3.2 microseconds.

Optionally, in another embodiment, the length of the CP of the first symbol in the N symbols of the high efficiency long training field is 3.2 microseconds, and the length of the CP of the another symbol in the N symbols of the high efficiency long training field is 0.8 microseconds.

Optionally, in another embodiment, the length of the CP of the first symbol in the N symbols of the high efficiency long training field is 3.2 microseconds, and the length of the CP of the another symbol in the N symbols of the high efficiency long training field is 1.6 microseconds.

Optionally, in another embodiment, the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in another embodiment, the physical layer packet does not include a high efficiency short training field HE-STF (also referred to as an HEW-STF). In this way, energy consumption of the sender device can be reduced.

Optionally, in another embodiment, the physical layer packet includes a high efficiency short training field. The high efficiency short training field may be used by the receiver device to perform functions such as AGC estimation or synchronization. This is not limited in the present embodiments. A length of the high efficiency short training field is 2.4 microseconds, 3.2 microseconds, 4.8 microseconds, 6.4 microseconds, or 12.8 microseconds.

Optionally, in another embodiment, a part or all of CPs of other symbols, except the CP of the first symbol, in the N symbols of the high efficiency long training field is used by the receiver device to perform fine AGC estimation.

Optionally, in another embodiment, the physical layer packet includes a legacy short training field, and the legacy short training field is used by the receiver device to perform AGC estimation.

This embodiment of the present invention is described in detail in the following with reference to specific examples. It should be noted that these examples are merely intended to help a person skilled in the art better understand this embodiment of the present invention, but are not intended to limit the scope of this embodiment of the present invention.

Implementation Manner 1.

After a legacy preamble (L-STF+L-LTF+L-SIG), or after a legacy preamble and an HE-SIG-1, a high efficiency short training field is not sent. A first symbol (HE-LTF1) of a high efficiency long training field uses a longer CP, and a receiver device uses the CP to perform automatic gain control.

A specific design of a physical layer packet is as follows: the CP of the HE-LTF1 is 3.2 μs (microseconds), and cyclic prefixes of an HE-LTF2 to an HE-LTFn are 0.8 μs. In a frequency domain, the HE-LTF1 and the HE-LTF2 to the HE-LTFn have a same subcarrier spacing and a same quantity of subcarriers. For example, in a bandwidth of 20 MHz, there are 256 subcarriers (or 64 subcarriers). A specific subcarrier quantity and subcarrier spacing are not limited in the present embodiments. In addition, when the HE-LTF1 is being sent, a correct time window function needs to be used, to avoid interfering with another symbol.

A length of a CP in a data part of the physical layer packet is usually equal to the lengths of the CPs of the HE-LTF2 to the HE-LTFn, and is not limited in this embodiment of the present invention. For example, in an indoor scenario, if the high efficiency long training field has only one symbol: an HE-LTF1, the HE-LTF1 may use a CP of 3.2 μs, and the data part may use a CP of 0.8 μs. Alternatively, if the high efficiency long training field has two symbols: an HE-LTF1 and an HE-LTF2, the HE-LTF1 may use a CP of 3.2 μs, the HE-LTF2 may use a CP of 0.8 μs, and the data part may also use a CP of 0.8 μs. The foregoing is merely several implementation manners of this embodiment of the present invention, and is not intended to limit the protection scope of this embodiment of the present invention.

Optionally, the cyclic prefix of the HE-LTF1 is 4.0 μs, 2.4 μs, or 1.6 μs, and the cyclic prefixes of the HE-LTF2 to the HE-LTFn are 0.8 μs.

Implementation manner 1 may be applied to a WLAN system in an indoor scenario. In the indoor scenario, such as in an IEEE 802.11ac standard, a VHT-STF occupies 4 μs, and a cyclic prefix of a VHT-LTF1 occupies 0.8 μs. According to this embodiment of the present invention, the HE-STF is not sent, and the cyclic prefix of the HE-LTF1 occupies 3.2 μs. Therefore, the preamble of the data packet can save 1.6 μs.

Implementation Manner 2.

Similar to Implementation manner 1, after a legacy preamble (L-STF+L-LTF+L-SIG), or after a legacy preamble and an HE-SIG-1, a high efficiency short training field is not sent. A specific design of a physical layer packet is as follows: a cyclic prefix of an HE-LTF1 is 3.2 µs, and cyclic prefixes of an HE-LTF2 to an HE-LTFn are 1.6 µs or 2.4 µs. In a frequency domain, the HE-LTF1 and the HE-LTF2 to the HE-LTFn have a same subcarrier spacing and a same quantity of subcarriers. For example, in a bandwidth of 20 MHz, there are 256 subcarriers (or 64 subcarriers). A specific subcarrier quantity and subcarrier spacing are not limited in the present embodiments. In addition, when the HE-LTF1 is being sent, a correct time window function needs to be used, to avoid interfering with another symbol.

A length of a CP in a data part of the physical layer packet is usually equal to the lengths of the CPs of the HE-LTF2 to the HE-LTFn, and is not limited in this embodiment of the present invention. For example, in an outdoor scenario, if the high efficiency long training field has only one symbol: an HE-LTF1, the HE-LTF1 may use a CP of 3.2 µs, and the data part may use a CP of 1.6 µs. Alternatively, if the high efficiency long training field has two symbols: an HE-LTF1 and an HE-LTF2, the HE-LTF1 may use a CP of 3.2 µs, the HE-LTF2 may use a CP of 1.6 µs, and the data part may also use a CP of 1.6 µs. The foregoing is merely several implementation manners of this embodiment of the present invention, and is not intended to limit the protection scope of this embodiment of the present invention.

Optionally, in another design, a cyclic prefix of an HE-LTF1 is 4.0 µs, 2.4 µs, or 1.6 µs, and cyclic prefixes of an HE-LTF2 to an HE-LTFn are 1.6 µs or 2.4 µs.

Implementation manner 2 may be applied to a WLAN system in an outdoor scenario. In the outdoor scenario, if the HE-STF occupies 4 µs, the cyclic prefix of the HE-LTF1 occupies 3.2 µs. According to this embodiment of the present invention, the HE-STF is not sent. The cyclic prefix of the HE-LTF1 occupies 3.2 µs, and at a receive end, is not only used to resist intersymbol interference, but also used for AGC estimation. Therefore, the preamble of the data packet can save 4 µs.

Implementation Manner 3.

Similar to Implementation manner 1, after a legacy preamble (L-STF+L-LTF+L-SIG), or after a legacy preamble and an HE-SIG-1, a high efficiency short training field is not sent. A cyclic prefix of an HE-LTF1 is 4.0 µs, and cyclic prefixes of an HE-LTF2 to an HE-LTFn are 3.2 µs. In a frequency domain, the HE-LTF1 and the HE-LTF2 to the HE-LTFn have a same subcarrier spacing and a same quantity of subcarriers. For example, in a bandwidth of 20 MHz, there are 256 subcarriers (or 64 subcarriers). A specific subcarrier quantity and subcarrier spacing are not limited in the present embodiments. In addition, when the HE-LTF1 is being sent, a correct time window function needs to be used, to avoid interfering with another symbol.

Implementation manner 3 may be applied to a WLAN system in an outdoor scenario.

FIG. 4 is a schematic flowchart of an automatic gain control method in a wireless local area network according to another embodiment of the present invention. The method in FIG. 4 may be executed by a receiver device, such as the AP 102 or the STAs (103a, 103b, 103c) shown in FIG. 1. More specifically, this method may be executed by a receiver of the receiver device.

401. Receive a physical layer packet from a sender device, where the physical layer packet includes a high efficiency long training field, the high efficiency long training field includes N symbols, a length of a CP of a first symbol in the N symbols is greater than or equal to a minimum length required by the receiver device to perform AGC estimation, and N is a positive integer.

As shown in FIG. 3, the physical layer packet (also referred to as a physical layer data packet) includes two parts: a preamble and data. The preamble includes a legacy preamble and a high efficiency preamble. The legacy preamble includes a legacy short training field L-STF, a legacy long training field L-LTF, and a legacy signal field L-SIG. The high efficiency preamble includes a high efficiency signal field HE-SIG-1 (also referred to as an HEW-SIG-1 or an HEW-SIG-A) and a high efficiency long training field HE-LTF (also referred to as an HEW-LTF).

The HE-LTF includes N symbols: an HE-LTF1, an HE-LTF2 . . . , and an HE-LTFN. A cyclic prefix (CP for short) of the first symbol HE-LTF1 in the N symbols is used by the receiver device to perform AGC estimation.

It should be understood that the physical packet shown in FIG. 3 is merely an example of the present embodiments, and is not intended to limit the protection scope of this embodiment of the present invention. For example, the physical layer packet may further include another part such as a high efficiency short training field HE-STF (also referred to as an HEW-STF). For another example, the physical layer packet may not include one or more fields in the foregoing legacy preamble, or the foregoing multiple fields may use different names. It should also be understood that the N symbols included in the high efficiency long training field may also be described as N sequences included in the high efficiency long training field.

It should also be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that the sender device generates the physical layer packet according to this minimum length.

402. Perform AGC estimation on a basis of the CP of the first symbol in the N symbols of the high efficiency long training field.

Figure 5:
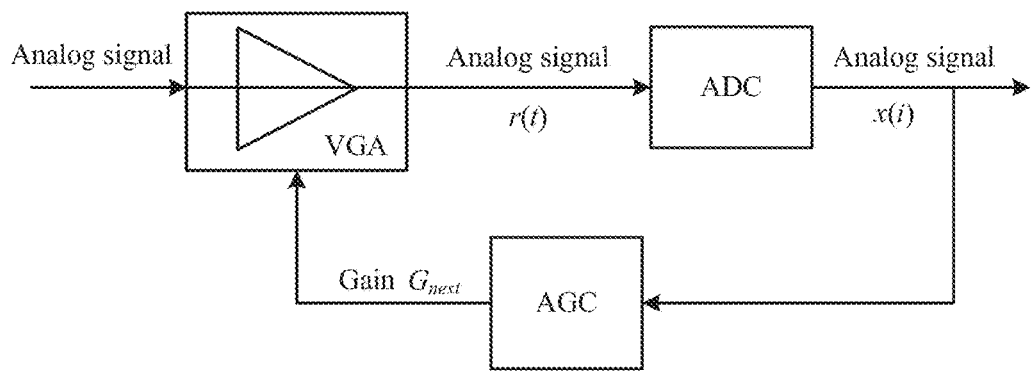
FIG. 5 is a schematic flowchart of AGC according to an embodiment of the present invention.

FIG. 5 is a schematic flowchart of AGC according to an embodiment of the present invention. An AGC module of the receiver mainly includes two parts: an estimation module and a gain adjustment module. A basic AGC principle is as follows: An amplified analog signal r(t) obtained after amplifying a received signal (such as the CP of the first symbol) by using a variable gain amplifier (VGA) is converted into a digital signal x(i) by using an analog to digital converter (ADC). The estimation module uses x(i) to calculate a gain of the VGA, that is, a gain $G_{next}$, and feeds back $G_{next}$ to the VGA. In this way, the gain adjustment module controls the VGA to adjust the gain of the VGA according to information fed back by the estimation module. Specifically, the gain $G_{next}$ may be estimated according to the following method.

Energy (or power) of M sampling points of x(i) is calculated to estimate the gain $G_{next}$. x(i) indicates an $i^{th}$ sample value signal converted by the ADC, and M represents an AGC control period. Therefore, an estimated energy value $P_{est}$ may be obtained according to signal energy estimated within a time of M sample values:

$$P_{est} = \frac{1}{N}\sum_{i=1}^{M} x^2(i). \tag{1}$$

In this way, the gain $G_{next}$ may be estimated according to formula (2):

$$G_{next} = G_p \frac{P_{ref}}{P_{est}}, \qquad (2)$$

where $G_{next}$ indicates a gain of the amplifier VGA during a next period N, $G_p$ indicates a current gain of the amplifier VGA, and $P_{ref}$ indicates an expected signal energy value.

AGC is performed according to power estimation of the sampling points in the foregoing method. AGC may also be performed according to amplitude estimation of the sampling points. A principle of the amplitude estimation is similar to that of the power estimation, and details are not described herein. The amplitude estimation is faster and easier than the power estimation.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

Optionally, in an embodiment, the length of the CP of the first symbol in the N symbols of the high efficiency long training field is greater than a length of a CP of another symbol in the N symbols.

For example, the length of the CP of the first symbol in the high efficiency long training field is extended, so that the length of the CP of the first symbol in the high efficiency long training field is greater than the length of the CP of the another symbol. When receiving the physical layer packet, the receiver device performs AGC estimation according to the length of the CP of the first symbol, and then performs AGC. In addition, intersymbol interference of the HE-LTF1 may further be reduced according to this embodiment of the present invention.

Optionally, in another embodiment, the length of the CP of the first symbol in the N symbols of the high efficiency long training field is 1.6 microseconds, 2.4 microseconds, 3.2 microseconds, or 4.0 microseconds.

Optionally, in another embodiment, when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in another embodiment, the length of the CP of the first symbol in the N symbols of the high efficiency long training field is 4.0 microseconds, and the length of the CP of the another symbol in the N symbols of the high efficiency long training field is 3.2 microseconds.

Optionally, in another embodiment, the length of the CP of the first symbol in the N symbols of the high efficiency long training field is 3.2 microseconds, and the length of the CP of the another symbol in the N symbols of the high efficiency long training field is 0.8 microseconds.

Optionally, in another embodiment, the length of the CP of the first symbol in the N symbols of the high efficiency long training field is 3.2 microseconds, and the length of the CP of the another symbol in the N symbols of the high efficiency long training field is 1.6 microseconds.

Optionally, in another embodiment, the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in another embodiment, the physical layer packet does not include a high efficiency short training field. In this way, energy consumption of the sender device can be reduced.

Optionally, in another embodiment, the physical layer packet includes a high efficiency short training field. The high efficiency short training field may be used by the receiver device to perform functions such as AGC estimation or synchronization. This is not limited in the present embodiments. A length of the high efficiency short training field is 2.4 microseconds, 3.2 microseconds, 4.8 microseconds, 6.4 microseconds, or 12.8 microseconds.

Optionally, in another embodiment, after the performing AGC estimation on a basis of the CP of the first symbol in the N symbols of the high efficiency long training field, fine AGC estimation is performed on a basis of a part or all of CPs of other symbols, except the CP of the first symbol, in the N symbols of the high efficiency long training field.

In this way, AGC accuracy may be further improved.

Optionally, in another embodiment, the physical layer packet includes a legacy short training field. Before the performing AGC estimation on a basis of the CP of the first symbol in the N symbols of the high efficiency long training field, AGC estimation is performed on a basis of the legacy short training field.

Figure 6:
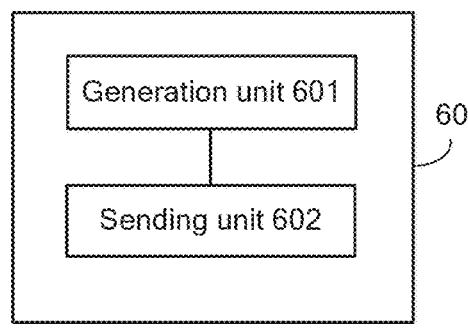
FIG. 6 is a schematic block diagram of a communications device according to an embodiment of the present invention.

FIG. 6 is a schematic block diagram of a communications device according to an embodiment of the present invention. A communications device 6o is a sender device such as the AP 102 or the STAs (103a, 103b, 103c) shown in FIG. 1. The communications device 60 includes a generation unit 601 and a sending unit 602.

The generation unit 601 is configured to generate a physical layer packet, where the physical layer packet includes a high efficiency long training field, the high efficiency long training field includes N symbols, a length of a CP of a first symbol in the N symbols is greater than or equal to a minimum length required by a receiver device to perform AGC estimation, and N is a positive integer.

As shown in FIG. 3, the physical layer packet (also referred to as a physical layer data packet) includes two parts: a preamble and data. The preamble includes a legacy preamble and a high efficiency preamble. The legacy preamble includes a legacy short training field L-STF, a legacy long training field L-LTF, and a legacy signal field L-SIG. The high efficiency preamble includes a high efficiency signal field HE-SIG-1 (also referred to as an HEW-SIG-1 or an HEW-SIG-A) and a high efficiency long training field HE-LTF (also referred to as an HEW-LTF).

The HE-LTF includes N symbols: an HE-LTF1, an HE-LTF2 . . . , and an HE-LTFN. A cyclic prefix (CP for short) of the first symbol HE-LTF1 in the N symbols is used by the receiver device to perform AGC estimation.

It should be understood that the physical packet shown in FIG. 3 is merely an example of the present embodiments, and is not intended to limit the protection scope of this embodiment of the present invention. For example, the physical layer packet may further include another part such as a high efficiency short training field HE-STF (also referred to as an HEW-STF). For another example, the physical layer packet may not include one or more fields in the foregoing legacy preamble, or the foregoing multiple fields may use different names. It should also be understood that the N symbols included in the high efficiency long training field may also be described as N sequences included in the high efficiency long training field.

It should also be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that the sender device generates the physical layer packet according to this minimum length.

The sending unit 602 is configured to send the physical layer packet to the receiver device.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

Optionally, in an embodiment, the length of the CP of the first symbol in the N symbols of the high efficiency long training field is greater than a length of a CP of another symbol in the N symbols.

For example, the length of the CP of the first symbol in the high efficiency long training field is extended, so that the length of the CP of the first symbol in the high efficiency long training field is greater than the length of the CP of the another symbol. When receiving the physical layer packet, the receiver device performs AGC estimation according to the length of the CP of the first symbol, and then performs AGC. In addition, intersymbol interference of the HE-LTF1 may further be reduced according to this embodiment of the present invention.

Optionally, in another embodiment, the length of the CP of the first symbol in the N symbols of the high efficiency long training field is 1.6 microseconds, 2.4 microseconds, 3.2 microseconds, or 4.0 microseconds.

Optionally, in another embodiment, when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in another embodiment, the length of the CP of the first symbol in the N symbols of the high efficiency long training field is 4.0 microseconds, and the length of the CP of the another symbol in the N symbols of the high efficiency long training field is 3.2 microseconds.

Optionally, in another embodiment, the length of the CP of the first symbol in the N symbols of the high efficiency long training field is 3.2 microseconds, and the length of the CP of the another symbol in the N symbols of the high efficiency long training field is 0.8 microseconds.

Optionally, in another embodiment, the length of the CP of the first symbol in the N symbols of the high efficiency long training field is 3.2 microseconds, and the length of the CP of the another symbol in the N symbols of the high efficiency long training field is 1.6 microseconds.

Optionally, in another embodiment, the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in another embodiment, the physical layer packet does not include a high efficiency short training field. In this way, energy consumption of the sender device can be reduced.

Optionally, in another embodiment, the physical layer packet includes a high efficiency short training field. The high efficiency short training field may be used by the receiver device to perform functions such as AGC estimation or synchronization. This is not limited in the present embodiments. A length of the high efficiency short training field is 2.4 microseconds, 3.2 microseconds, 4.8 microseconds, 6.4 microseconds, or 12.8 microseconds.

Optionally, in another embodiment, a part or all of CPs of other symbols, except the CP of the first symbol, in the N symbols of the high efficiency long training field is used by the receiver device to perform fine AGC estimation.

Optionally, in another embodiment, the physical layer packet includes a legacy short training field, and the legacy short training field is used by the receiver device to perform AGC estimation.

Figure 7:
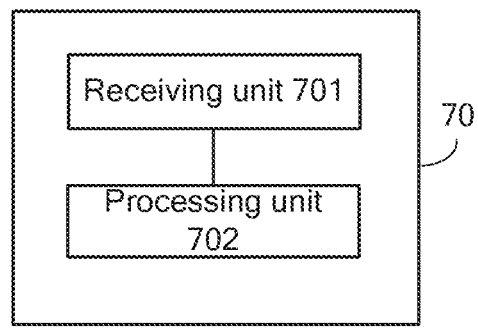
FIG. 7 is a schematic block diagram of a communications device according to another embodiment of the present invention.

FIG. 7 is a schematic block diagram of a communications device according to another embodiment of the present invention. A communications device 60 is a receiver device such as the AP 102 or the STAs (103*a*, 103*b*, 103*c*) shown in FIG. 1. A communications device 70 includes a receiving unit 701 and a processing unit 702.

The receiving unit 701 is configured to receive a physical layer packet from a sender device, where the physical layer packet includes a high efficiency long training field, the high efficiency long training field includes N symbols, a length of a CP of a first symbol in the N symbols is greater than or equal to a minimum length required by the receiver device to perform AGC estimation, and N is a positive integer.

As shown in FIG. 3, the physical layer packet (also referred to as a physical layer data packet) includes two parts: a preamble and data. The preamble includes a legacy preamble and a high efficiency preamble. The legacy preamble includes a legacy short training field L-STF, a legacy long training field L-LTF, and a legacy signal field L-SIG. The high efficiency preamble includes a high efficiency signal field HE-SIG-1 (also referred to as an HEW-SIG-1 or an HEW-SIG-A) and a high efficiency long training field HE-LTF (also referred to as an HEW-LTF).

The HE-LTF includes N symbols: an HE-LTF1, an HE-LTF2 . . . , and an HE-LTFN. A cyclic prefix (CP for short) of the first symbol HE-LTF1 in the N symbols is used by the receiver device to perform AGC estimation.

It should be understood that the physical packet shown in FIG. 3 is merely an example of the present embodiments, and is not intended to limit the protection scope of this embodiment of the present invention. For example, the physical layer packet may further include another part such as a high efficiency short training field HE-STF (also referred to as an HEW-STF). For another example, the physical layer packet may not include one or more fields in the foregoing legacy preamble, or the foregoing multiple fields may use different names. It should also be understood that the N symbols included in the high efficiency long training field may also be described as N sequences included in the high efficiency long training field.

It should also be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that the sender device generates the physical layer packet according to this minimum length.

The processing unit 702 is configured to perform AGC estimation on a basis of the CP of the first symbol in the N symbols of the high efficiency long training field.

For a method for performing AGC estimation by the processing unit 702 on a basis of the CP of the first symbol, refer to the foregoing description in FIG. 5. To avoid repetition, details are not described herein again.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

Optionally, in an embodiment, the length of the CP of the first symbol in the N symbols of the high efficiency long training field is greater than a length of a CP of another symbol in the N symbols.

For example, the length of the CP of the first symbol in the high efficiency long training field is extended, so that the length of the CP of the first symbol in the high efficiency long training field is greater than the length of the CP of the another symbol. When receiving the physical layer packet, the receiver device performs AGC estimation according to the length of the CP of the first symbol, and then performs AGC. In addition, intersymbol interference of the HE-LTF1 may further be reduced according to this embodiment of the present invention.

Optionally, in another embodiment, the length of the CP of the first symbol in the N symbols of the high efficiency long training field is 1.6 microseconds, 2.4 microseconds, 3.2 microseconds, or 4.0 microseconds.

Optionally, in another embodiment, when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in another embodiment, the length of the CP of the first symbol in the N symbols of the high efficiency long training field is 4.0 microseconds, and the length of the CP of the another symbol in the N symbols of the high efficiency long training field is 3.2 microseconds.

Optionally, in another embodiment, the length of the CP of the first symbol in the N symbols of the high efficiency long training field is 3.2 microseconds, and the length of the CP of the another symbol in the N symbols of the high efficiency long training field is 0.8 microseconds.

Optionally, in another embodiment, the length of the CP of the first symbol in the N symbols of the high efficiency long training field is 3.2 microseconds, and the length of the CP of the another symbol in the N symbols of the high efficiency long training field is 1.6 microseconds.

Optionally, in another embodiment, the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in another embodiment, the physical layer packet does not include a high efficiency short training field. In this way, energy consumption of the sender device can be reduced.

Optionally, in another embodiment, the physical layer packet includes a high efficiency short training field. The high efficiency short training field may be used by the receiver device to perform functions such as AGC estimation or synchronization. This is not limited in the present embodiments. A length of the high efficiency short training field is 2.4 microseconds, 3.2 microseconds, 4.8 microseconds, 6.4 microseconds, or 12.8 microseconds.

Optionally, in another embodiment, the processing unit 702 is further configured to perform fine AGC estimation on a basis of a part or all of CPs of other symbols, except the CP of the first symbol, in the N symbols of the high efficiency long training field. In this way, AGC accuracy may be further improved.

Optionally, in another embodiment, the physical layer packet includes a legacy short training field. In this case, the processing unit 702 is further configured to perform AGC estimation on a basis of the legacy short training field.

Figure 8:
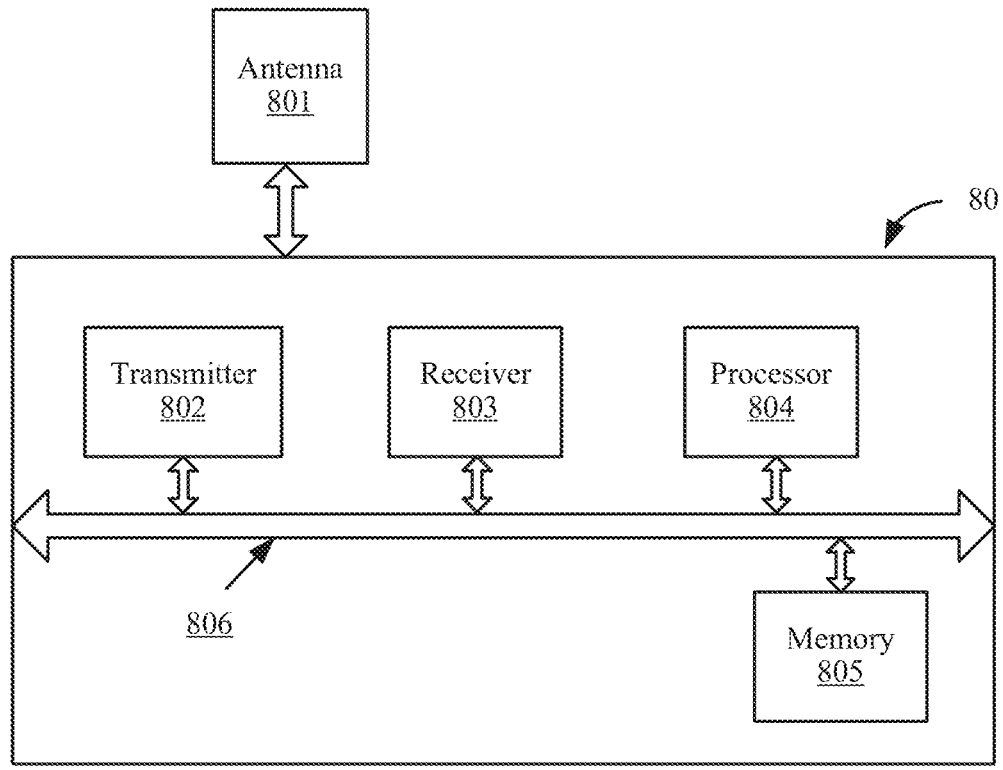
FIG. 8 is a schematic block diagram of a communications device according to another embodiment of the present invention.

FIG. 8 is a schematic block diagram of a communications device according to another embodiment of the present invention.

A communications device 80 in FIG. 8 may be configured to implement all steps and methods in the foregoing method embodiments. In this embodiment shown in FIG. 8, the communications device 80 includes an antenna 801, a transmitter 802, a receiver 803, a processor 804, and a memory 805. The processor 804 controls an operation of the communications device 80, and can be used for signal processing. The memory 805 may include a read-only memory and a random access memory, and provides an instruction and data for the processor 804. The transmitter 802 and the receiver 803 may be coupled to the antenna 801. All the components of the communications device 80 are coupled together by using a bus system 806. The bus system 806 may further include a power bus, a control bus, and a status signal bus in addition to a data bus. However, for clear description, various types of buses in the figure are marked as the bus system 806. For example, the communications device 80 is a receiver device such as the AP 102 or the STAs (103a, 103b, 103c) shown in FIG. 1.

Specifically, the memory 805 may store an instruction for the processor 804 to execute the following process: generating a physical layer packet, where the physical layer packet includes a high efficiency long training field, the high efficiency long training field includes N symbols, a length of a CP of a first symbol in the N symbols is greater than or equal to a minimum length required by the receiver device to perform AGC estimation, and N is a positive integer; and sending the physical layer packet to the receiver device.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

It should be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that a sender device generates the physical layer packet according to this minimum length.

Optionally, in an embodiment, the memory 805 may further store an instruction for the processor 804 to execute the following process: the length of the CP of the first symbol in the N symbols of the high efficiency long training field is greater than a length of a CP of another symbol in the N symbols.

In this way, intersymbol interference of an HE-LTF1 may further be reduced according to this embodiment of the present invention.

Optionally, in an embodiment, the memory 805 may further store an instruction for the processor 804 to execute the following process: the length of the CP of the first symbol in the N symbols of the high efficiency long training field is 1.6 microseconds, 2.4 microseconds, 3.2 microseconds, or 4.0 microseconds.

Optionally, in an embodiment, the memory 805 may further store an instruction for the processor 804 to execute the following process: when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in an embodiment, the memory 805 may further store an instruction for the processor 804 to execute the following process: the length of the CP of the first symbol in the N symbols of the high efficiency long training field is 4.0 microseconds, and the length of the CP of the another symbol in the N symbols of the high efficiency long training field is 3.2 microseconds.

Optionally, in an embodiment, the memory 805 may further store an instruction for the processor 804 to execute the following process: the length of the CP of the first symbol in the N symbols of the high efficiency long training field is 3.2 microseconds, and the length of the CP of the another symbol in the N symbols of the high efficiency long training field is 0.8 microseconds.

Optionally, in an embodiment, the memory 805 may further store an instruction for the processor 804 to execute the following process: the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in an embodiment, the memory 805 may further store an instruction for the processor 804 to execute the following process: the physical layer packet does not include a high efficiency short training field.

In this way, energy consumption of the sender device can be reduced.

Optionally, in an embodiment, the memory 805 may further store an instruction for the processor 804 to execute the following process: the physical layer packet includes a high efficiency short training field, and a length of the high efficiency short training field is 2.4 microseconds, 3.2 microseconds, 4.8 microseconds, 6.4 microseconds, or 12.8 microseconds.

Figure 9:
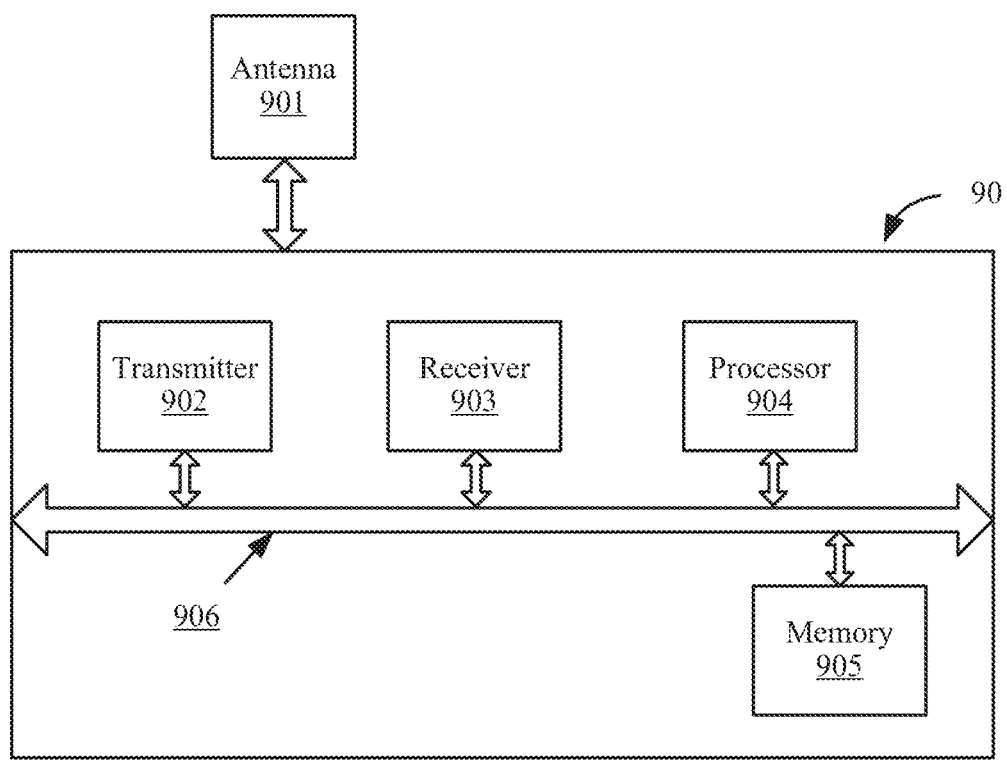
FIG. 9 is a schematic block diagram of a communications device according to another embodiment of the present invention.

FIG. 9 is a schematic block diagram of a communications device according to another embodiment of the present invention.

A communications device 90 in FIG. 9 may be configured to implement all steps and methods in the foregoing method embodiments. In this embodiment shown in FIG. 9, the communications device 90 includes an antenna 901, a transmitter 902, a receiver 903, a processor 904, and a memory 905. The processor 904 controls an operation of the communications device 90, and can be used for signal processing. The memory 905 may include a read-only memory and a random access memory, and provides an instruction and data for the processor 904. The transmitter 902 and the receiver 903 may be coupled to the antenna 901. All the components of the communications device 90 are coupled together by using a bus system 906. The bus system 906 may further include a power bus, a control bus, and a status signal bus in addition to a data bus. However, for clear description, various types of buses in the figure are marked as the bus system 906. For example, the communications device 90 is a receiver device such as the AP 102 or the STAs (103a, 103b, 103c) shown in FIG. 1.

Specifically, the memory 905 may store an instruction for the processor 904 to execute the following process: receiving a physical layer packet from a sender device, where the physical layer packet includes a high efficiency long training field, the high efficiency long training field includes N symbols, a length of a CP of a first symbol in the N symbols is greater than or equal to a minimum length required by the receiver device to perform AGC estimation, and N is a positive integer; and performing AGC estimation on a basis of the CP of the first symbol in the N symbols of the high efficiency long training field.

Based on the foregoing technical solutions, a CP of a first symbol of a high efficiency long training field of a physical layer packet not only can prevent intersymbol interference, but also can be used by a receiver device to perform AGC estimation. In this way, under a same AGC accuracy requirement, a length of a preamble of the physical layer packet can be reduced, and then system overheads can be reduced.

It should be understood that the minimum length required by the receiver device to perform AGC estimation is related to an AGC accuracy requirement. For example, the minimum length required for AGC estimation may be determined according to a threshold of the AGC accuracy requirement. Then the minimum length is set at a sender device side, so that the sender device generates the physical layer packet according to this minimum length.

Optionally, in an embodiment, the memory 905 may further store an instruction for the processor 904 to execute the following process: the length of the CP of the first symbol in the N symbols of the high efficiency long training field is greater than a length of a CP of another symbol in the N symbols.

In this way, intersymbol interference of an HE-LTF1 may further be reduced according to this embodiment of the present invention.

Optionally, in another embodiment, the memory 905 may further store an instruction for the processor 904 to execute the following process: the length of the CP of the first symbol in the N symbols of the high efficiency long training field is 1.6 microseconds, 2.4 microseconds, 3.2 microseconds, or 4.0 microseconds.

Optionally, in another embodiment, the memory 905 may further store an instruction for the processor 904 to execute the following process: when N is greater than or equal to 2, a length of a CP of each of a second symbol to an $N^{th}$ symbol in the N symbols of the high efficiency long training field is 0.8 microseconds, 1.6 microseconds, 2.4 microseconds, or 3.2 microseconds.

Optionally, in another embodiment, the memory 905 may further store an instruction for the processor 904 to execute the following process: the length of the CP of the first symbol in the N symbols of the high efficiency long training field is 4.0 microseconds, and the length of the CP of the another symbol in the N symbols of the high efficiency long training field is 3.2 microseconds.

Optionally, in another embodiment, the memory 905 may further store an instruction for the processor 904 to execute the following process: the length of the CP of the first symbol in the N symbols of the high efficiency long training field is 3.2 microseconds, and the length of the CP of the another symbol in the N symbols of the high efficiency long training field is 0.8 microseconds.

Optionally, in another embodiment, the memory 905 may further store an instruction for the processor 904 to execute the following process: the length of the CP of the first symbol in the N symbols of the high efficiency long training field is equal to the length of the CP of the another symbol in the N symbols, and the length of the CP of the first symbol in the N symbols of the high efficiency long training field is 1.6 microseconds, 2.4 microseconds, or 3.2 microseconds.

Optionally, in another embodiment, the memory 905 may further store an instruction for the processor 904 to execute the following process: the physical layer packet does not include a high efficiency short training field. In this way, energy consumption of the sender device can be reduced.

Optionally, in another embodiment, the memory 905 may further store an instruction for the processor 904 to execute the following process: the physical layer packet includes a high efficiency short training field, and a length of the high efficiency short training field is 2.4 microseconds, 3.2 microseconds, 4.8 microseconds, 6.4 microseconds, or 12.8 microseconds.

Optionally, in another embodiment, the memory 905 may further store an instruction for the processor 904 to execute the following process: after the performing AGC estimation on a basis of the CP of the first symbol in the N symbols of the high efficiency long training field, performing fine AGC estimation on a basis of a part or all of CPs of other symbols, except the CP of the first symbol, in the N symbols of the high efficiency long training field. In this way, AGC accuracy may be further improved.

Optionally, in another embodiment, the memory 905 may further store an instruction for the processor 904 to execute the following process: the physical layer packet includes a legacy short training field; and before the performing AGC estimation on a basis of the CP of the first symbol in the N symbols of the high efficiency long training field, AGC estimation is performed on a basis of the legacy short training field.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present embodiments.

It may be clearly understood by a person skilled in the art that, for the purpose of convenient and brief description, for a detailed working process of the foregoing system, apparatus, and unit, reference may be made to a corresponding process in the foregoing method embodiments, and details are not described herein.

In the several embodiments provided in this application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present embodiments essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present invention. The foregoing storage medium includes: any medium that can store program code, such as a universal serial bus (USB) flash drive, a removable hard disk, a read-only memory (ROM for short), a random access memory (RAM for short), a magnetic disk, or an optical disc.

The foregoing descriptions are merely specific embodiments of the present invention, but are not intended to limit the protection scope of the present embodiments. Any modification or replacement readily figured out by a person skilled in the art within the technical scope disclosed in the present embodiments shall fall within the protection scope of the present embodiments. Therefore, the protection scope of the present embodiments shall be subject to the protection scope of the claims.

What is claimed is:

1. A method, comprising:
    generating, by a transmitter device, a physical layer packet comprising a high efficiency long training field, wherein the high efficiency long training field comprises N symbols, wherein a first length of a first cyclic prefix (CP) of a first symbol in the N symbols is greater than or equal to a minimum length for a receiver device to perform automatic gain control (AGC) estimation, wherein the first length of the first CP of the first symbol in the N symbols of the high efficiency long training field is greater than a length of a CP of another symbol in the N symbols of the high efficiency long training field, and wherein N is a positive integer; and sending, by the transmitter device, the physical layer packet to the receiver device.

2. The method according to claim 1, wherein the physical layer packet does not comprise a high efficiency short training field.

3. The method according to claim 1, wherein the first length of the first CP of the first symbol in the N symbols of the high efficiency long training field is equal to one of 1.6 microseconds, 2.4 microseconds, 3.2 microseconds, and 4.0 microseconds.

4. The method according to claim 1, wherein, when N is greater than or equal to 2, lengths of CPs of symbols from a second symbol to an $N^{th}$ symbol in the N symbols of the high efficiency long training field is equal to one of 0.8 microseconds, 1.6 microseconds, 2.4 microseconds, and 3.2 microseconds.

5. The method according to claim 1, wherein sending the physical layer packet to the receiver device causes the receiver device to perform AGC estimation with the first CP of the first symbol in the N symbols and to perform fine AGC estimation with one or more remaining CPs corresponding to one or more remaining symbols in the N symbols.

6. A method, comprising:
receiving, by a receiver device, a physical layer packet from a sender device, wherein the physical layer packet comprises a high efficiency long training field, wherein the high efficiency long training field comprises N symbols, wherein a first length of a first cyclic prefix (CP) of a first symbol in the N symbols is greater than or equal to a minimum length for the receiver device to perform automatic gain control (AGC) estimation, wherein the first length of the first CP of the first symbol in the N symbols of the high efficiency long training field is greater than a length of a CP of another symbol in the N symbols of the high efficiency long training field, and wherein N is a positive integer; and
performing AGC estimation in accordance with the first CP of the first symbol in the N symbols of the high efficiency long training field.

7. The method according to claim 6, wherein the physical layer packet does not comprise a high efficiency short training field.

8. The method according to claim 6 wherein the first length of the first CP of the first symbol in the N symbols of the high efficiency long training field is equal to one of 1.6 microseconds, 2.4 microseconds, 3.2 microseconds, and 4.0 microseconds.

9. The method according to claim 6, wherein, when N is greater than or equal to 2, lengths of CPs of symbols from a second symbol to an $N^{th}$ symbol in the N symbols of the high efficiency long training field is equal to one of 0.8 microseconds, 1.6 microseconds, 2.4 microseconds, and 3.2 microseconds.

10. The method according to claim 6, further comprising:
performing AGC estimation in accordance with remaining CPs corresponding to remaining symbols, other than the first symbol, in the N symbols.

11. A communications device, comprising:
a processor; and
a non-transitory computer readable storage medium storing a program for execution by the processor, the program including instructions to:
generate a physical layer packet comprising a high efficiency long training field, wherein the high efficiency long training field comprises N symbols, wherein a first length of a first CP of a first symbol in the N symbols is greater than or equal to a minimum length for a receiver device to perform automatic gain control (AGC) estimation, wherein the first length of the first CP of the first symbol in the N symbols of the high efficiency long training field is greater than a length of a CP of another symbol in the N symbols of the high efficiency long training field, and wherein N is a positive integer; and
send the physical layer packet to the receiver device.

12. The communications device according to claim 11, wherein the physical layer packet does not comprise a high efficiency short training field.

13. The communications device according to claim 11, wherein the first length of the first CP of the first symbol in the N symbols of the high efficiency long training field is equal to one of 1.6 microseconds, 2.4 microseconds, 3.2 microseconds, and 4.0 microseconds.

14. The communications device according to claim 11, wherein, when N is greater than or equal to 2, a length of a CP of symbols from a second symbol to an $N^{th}$ symbol in the N symbols of the high efficiency long training field is equal to one of 0.8 microseconds, 1.6 microseconds, 2.4 microseconds, and 3.2 microseconds.

15. The communications device according to claim 11, wherein the instructions to send the physical layer packet to the receiver device cause the receiver device to perform AGC estimation with the first CP of the first symbol in the N symbols and to perform fine AGC estimation with one or more remaining CPs corresponding to one or more remaining symbols in the N symbols.

16. A communications device, comprising:
a processor; and
a non-transitory computer readable storage medium storing a program for execution by the processor, the program including instructions to:
receive a physical layer packet from a sender device, wherein the physical layer packet comprises a high efficiency long training field, wherein the high efficiency long training field comprises N symbols, wherein a first length of a first cyclic prefix (CP) of a first symbol in the N symbols is greater than or equal to a minimum length for a receiver device to perform automatic gain control (AGC) estimation, wherein the first length of the first CP of the first symbol in the N symbols of the high efficiency long training field is greater than a length of a CP of another symbol in the N symbols of the high efficiency long training field, and wherein N is a positive integer; and
perform AGC estimation in accordance with the first CP of the first symbol in the N symbols of the high efficiency long training field.

17. The communications device according to claim 16, wherein the physical layer packet does not comprise a high efficiency short training field.

18. The communications device according to claim 16, wherein the first length of the first CP of the first symbol in the N symbols of the high efficiency long training field is equal to one of 1.6 microseconds, 2.4 microseconds, 3.2 microseconds, and 4.0 microseconds.

19. The communications device according to claim 16, wherein, when N is greater than or equal to 2, a length of a CP of symbols from a second symbol to an $N^{th}$ symbol in the N symbols of the high efficiency long training field is equal to one of 0.8 microseconds, 1.6 microseconds, 2.4 microseconds, and 3.2 microseconds.

20. The communications device according to claim 16, wherein the program further includes instructions to:
   perform AGC estimation in accordance with remaining CPs corresponding to remaining symbols, other than the first symbol, in the N symbols.

* * * * *